(12) United States Patent
Harris

(10) Patent No.: US 10,128,418 B2
(45) Date of Patent: Nov. 13, 2018

(54) LED CAP CONTAINING QUANTUM DOT PHOSPHORS

(71) Applicant: Nanoco Technologies Ltd., Manchester (GB)

(72) Inventor: James Harris, Manchester (GB)

(73) Assignee: Nanoco Technologies Ltd., Manchester (GB)

(*) Notice: Subject to any disclaimer, the term of this patent is extended or adjusted under 35 U.S.C. 154(b) by 0 days.

(21) Appl. No.: 15/159,538

(22) Filed: May 19, 2016

(65) Prior Publication Data

US 2016/0268486 A1     Sep. 15, 2016

Related U.S. Application Data

(62) Division of application No. 14/539,744, filed on Nov. 12, 2014.

(Continued)

(51) Int. Cl.
*H01L 33/50* (2010.01)
*H01L 33/48* (2010.01)
(Continued)

(52) U.S. Cl.
CPC ............ *H01L 33/504* (2013.01); *C09K 11/54* (2013.01); *C09K 11/565* (2013.01); *C09K 11/70* (2013.01); *H01L 33/483* (2013.01); *H01L 33/505* (2013.01); *H01L 33/507* (2013.01); *H01L 33/56* (2013.01); *H01L 33/58* (2013.01); *B82Y 20/00* (2013.01); *H01L 33/502* (2013.01); *H01L 2224/48091* (2013.01); *H01L 2933/0041* (2013.01); *H01L 2933/0083* (2013.01);

(Continued)

(58) Field of Classification Search
CPC ... H01L 33/483; H01L 33/502; H01L 33/504; H01L 33/505; H01L 33/507; H01L 33/48–33/508
See application file for complete search history.

(56) References Cited

U.S. PATENT DOCUMENTS 6,379,635 B2    4/2002   O'Brien et al.
7,084,435 B2    8/2006   Sugimoto et al.
(Continued)

FOREIGN PATENT DOCUMENTS

JP    2000261039 A    9/2000
JP    2004349647 A    12/2004
(Continued)

OTHER PUBLICATIONS

International Search Report and Written Opinion received in corresponding PCT patent application No. PCT/IB2014/003032, dated Jun. 1, 2015.

*Primary Examiner* — Stephen Bradley
(74) *Attorney, Agent, or Firm* — Blank Rome, LLP

(57) ABSTRACT

An LED device has a cap containing one or more quantum dot (QD) phosphors. The cap may be sized and configured to be integrated with standard LED packages. The QD phosphor may be held within the well of the LED package, so as to absorb the maximum amount of light emitted by the LED, but arranged in spaced-apart relation from the LED chip to avoid excessive heat that can lead to degradation of the QD phosphor(s). The packages may be manufactured and stored for subsequent assembly onto an LED device.

27 Claims, 5 Drawing Sheets

Related U.S. Application Data

(60) Provisional application No. 61/903,503, filed on Nov. 13, 2013.

(51) Int. Cl.
  *C09K 11/54* (2006.01)
  *C09K 11/56* (2006.01)
  *C09K 11/70* (2006.01)
  *H01L 33/56* (2010.01)
  *H01L 33/58* (2010.01)
  *B82Y 20/00* (2011.01)

(52) U.S. Cl.
  CPC ........ *Y10S 977/774* (2013.01); *Y10S 977/825* (2013.01); *Y10S 977/95* (2013.01)

(56) References Cited

U.S. PATENT DOCUMENTS

| | | | |
|---|---|---|---|
| 7,304,326 B2* | 12/2007 | Suehiro | H01L 33/56 257/100 |
| 7,588,828 B2 | 9/2009 | Mushtag et al. | |
| 7,803,423 B2 | 9/2010 | O'Brien et al. | |
| 7,867,556 B2 | 1/2011 | Pickett | |
| 7,867,557 B2 | 1/2011 | Picket et al. | |
| 8,017,972 B2* | 9/2011 | Lee | C09K 11/025 257/103 |
| 8,747,697 B2 | 6/2014 | Clatterbuck et al. | |
| 8,957,401 B2 | 2/2015 | Pickett et al. | |
| 9,153,749 B2 | 10/2015 | Kim et al. | |
| 2004/0116033 A1 | 6/2004 | Ouderkirk et al. | |
| 2005/0093430 A1 | 5/2005 | Ibbetson et al. | |
| 2007/0004065 A1 | 1/2007 | Schardt et al. | |
| 2007/0096113 A1* | 5/2007 | Inoshita | H01L 33/507 257/79 |
| 2008/0023714 A1* | 1/2008 | Chae | H01L 33/507 257/98 |
| 2010/0068522 A1* | 3/2010 | Pickett | B82Y 30/00 428/402 |
| 2010/0123155 A1* | 5/2010 | Pickett | B82Y 15/00 257/98 |
| 2011/0068322 A1 | 3/2011 | Pickett et al. | |
| 2013/0140600 A1 | 6/2013 | Harris et al. | |
| 2013/0175558 A1 | 7/2013 | Orsley et al. | |
| 2014/0054619 A1* | 2/2014 | Tseng | H01L 33/504 257/88 |
| 2014/0167601 A1* | 6/2014 | Harry | C09K 11/0883 313/503 |
| 2014/0346547 A1* | 11/2014 | Park | H01L 33/644 257/98 |
| 2015/0123156 A1* | 5/2015 | Eberhardt | H05B 33/14 257/98 |

FOREIGN PATENT DOCUMENTS

| | | |
|---|---|---|
| JP | 2007173754 A | 5/2007 |
| JP | 2007200949 A | 8/2007 |
| JP | 2008305802 A | 12/2008 |
| JP | 2010087324 A | 4/2010 |
| JP | 2010103404 A | 5/2010 |
| JP | 2010251621 A | 11/2010 |
| JP | 2013033833 A | 2/2013 |
| JP | 2013065812 A | 4/2013 |
| JP | 2013211250 A | 10/2013 |
| KR | 10-2008-0010535 B1 | 1/2008 |
| KR | 10-2012-0140052 A | 12/2012 |
| KR | 10-2013-0029547 B1 | 3/2013 |
| WO | 2010015824 A1 | 2/2010 |
| WO | 2012132236 A1 | 10/2012 |
| WO | 2012164283 A1 | 12/2012 |
| WO | 20120164283 A1 | 12/2012 |
| WO | 2013118076 A1 | 8/2013 |
| WO | 20130150388 A2 | 10/2013 |

* cited by examiner

LED CAP CONTAINING QUANTUM DOT PHOSPHORS

CROSS-REFERENCE TO RELATED APPLICATIONS

This application is a division of U.S. application Ser. No. 14/539,744, filed Nov. 12, 2014, and claiming the benefit of U.S. Provisional Application No. 61/903,503 filed on Nov. 13, 2013.

STATEMENT REGARDING FEDERALLY SPONSORED RESEARCH OR DEVELOPMENT

Not Applicable

BACKGROUND OF THE INVENTION

1. Field of the Invention

The present invention generally relates to lighting devices. More particularly, it relates to light-emitting diodes (LEDs) incorporating phosphors for modifying their spectral output.

2. Description of the Related Art Including Information Disclosed Under 37 CFR 1.97 and 1.98

There has been substantial interest in exploiting the properties of compound semiconductors consisting of particles with dimensions in the order of 2-50 nm, often referred to as quantum dots (QDs) or nanocrystals. These materials are of commercial interest due to their size-tuneable electronic properties which can be exploited in many commercial applications such as optical and electronic devices, and other applications that range from biological labelling, photovoltaics, catalysis, biological imaging, LEDs, general space lighting and electroluminescent displays, amongst many new and emerging applications.

The most studied of semiconductor materials have been the chalcogenide II-VI materials, namely ZnS, ZnSe, CdS, CdSe, CdTe; most noticeably CdSe due to its tuneability over the visible region of the spectrum. Reproducible methods for the large-scale production of these materials have been developed from "bottom up" techniques, wherein particles are prepared atom-by-atom, i.e., from molecules to clusters to particles, using "wet chemical" procedures. However, cadmium and other restricted heavy metals used in conventional QDs are highly toxic elements and represent a major concern in commercial applications. The inherent toxicity of cadmium-containing QDs prevents their use in any application involving animals or humans. For example, recent studies suggest that QDs made of a cadmium chalcogenide semiconductor material can be cytotoxic in a biological environment unless protected. Specifically, oxidation or chemical attack through a variety of pathways can lead to the formation of cadmium ions on the surface of the QD that can be released into the surrounding environment.

Such toxicity affects not only the progress of biological applications but also other applications including optoelectronic and communication because heavy metal-based materials are widespread in many commercial products including household appliances such as IT and telecommunication equipment, lighting equipment, electrical and electronic tools, toys, leisure and sports equipment. Legislation to restrict or ban certain heavy metals in commercial products has been already implemented in many regions of the world. For example, the European Union directive 2002/95/EC, known as the "Restrictions on the use of Hazardous Substances in electronic equipment" (or RoHS), banned the sale of new electrical and electronic equipment containing more than agreed levels of lead, cadmium, mercury, hexavalent chromium along with polybrominated biphenyl (PBB) and polybrominated diphenyl ether (PBDE) flame retardants. This law required manufacturers to find alternative materials and develop new engineering processes for the creation of common electronic equipment. In addition, on Jun. 1, 2007, a European Community Regulation came into force concerning chemicals and their safe use (EC 1907/2006). The Regulation deals with the Registration, Evaluation, Authorization and Restriction of Chemical substances and is known as "REACH." The REACH Regulation gives greater responsibility to industry to manage the risks from chemicals and to provide safety information on the substances. It is anticipated that similar regulations will be enacted in other countries including China, Korea, Japan and the US. Thus, there is significant economic incentive to develop alternatives to II-VI QD materials.

Other semiconductor nanoparticles that have generated considerable interest include nanoparticles incorporating III-V and IV-VI materials, such as GaN, GaP, GaAs, InP, and InAs. Due to their increased covalent nature III-V and IV-VI highly crystalline semiconductor nanoparticles are more difficult to prepare and much longer annealing times are usually required. However, there are now reports of III-VI and IV-VI materials being prepared in a similar manner as are used for the II-VI materials. Methods of synthesizing core and core-shell nanoparticles are disclosed, for example, in U.S. Pat. Nos. 6,379,635, 7,803,423, 7,588,828, 7,867,556, and 7,867,557. The contents of each of these patents is hereby incorporated by reference, in their entirety.

Two fundamental factors, both related to the size of the individual semiconductor nanoparticle, are responsible for their unique properties. The first is the large surface-area-to-volume ratio; as a particle becomes smaller, the ratio of the number of surface atoms to those in the interior increases. This leads to the surface properties playing an important role in the overall properties of the material. The second factor being, with many materials including semiconductor nanoparticles, that there is a change in the electronic properties of the material with size; moreover, because of quantum confinement effects, the band gap gradually becomes larger as the size of the particle decreases. This effect is a consequence of the confinement of an "electron in a box" giving rise to discrete energy levels similar to those observed in atoms and molecules, rather than a continuous band as observed in the corresponding bulk semiconductor material. Thus, for a semiconductor nanoparticle, because of the physical parameters, the electron and hole produced by the absorption of electromagnetic radiation (a photon, with energy greater than the first excitonic transition), are closer together than they would be in the corresponding macrocrystalline material, moreover the Coulombic interaction cannot be neglected. This leads to a narrow bandwidth emission, which is dependent upon the particle size and composition of the nanoparticle material. Thus, quantum dots have higher kinetic energy than the corresponding macrocrystalline material and consequently the first excitonic transition (band gap) increases in energy with decreasing particle diameter.

Core semiconductor nanoparticles, which consist of a single semiconductor material along with an outer organic passivating layer, tend to have relatively low quantum efficiencies due to electron-hole recombination occurring at defects and dangling bonds situated on the nanoparticle surface which can lead to non-radiative electron-hole recombinations. One method to eliminate defects and dangling bonds on the inorganic surface of the quantum dot is to epitaxially grow a second inorganic material, having a wider band-gap and small lattice mismatch to that of the core material, on the surface of the core particle to produce a "core-shell" particle. Core-shell particles separate any carriers confined in the core from surface states that would otherwise act as non-radiative recombination centers. One example is a ZnS shell grown on the surface of a CdSe core. Another approach is to prepare a core-multi shell structure where the electron-hole pair is completely confined to a single shell layer consisting of a few monolayers of a specific material such as a quantum dot-quantum well structure. Here, the core is of a wide band gap material, followed by a thin shell of narrower band gap material, and capped with a further wide band gap layer, such as CdS/HgS/CdS grown using substitution of Hg for Cd on the surface of the core nanocrystal to deposit just a few monolayers of HgS, which is then over-grown by a monolayer of CdS. The resulting structures exhibit clear confinement of photo-excited carriers in the HgS layer. One of the most common approaches to add further stability to quantum dots and help to confine the electron-hole pair is epitaxially growing a compositionally graded alloy layer on the core. This can help to alleviate strain that could otherwise lead to defects. Moreover, for a CdSe core, in order to improve structural stability and quantum yield, rather than growing a shell of ZnS directly on the core, a graded alloy layer of $Cd_{1-x}Zn_xSe_{1-y}S_y$ can be used. This has been found to greatly enhance the photoluminescence emission of the quantum dots.

Doping quantum dots with atomic impurities is also an efficient way of manipulating the emission and absorption properties of the nanoparticle. Procedures for doping of wide band gap materials, such as zinc selenide and zinc sulfide, with manganese and copper (ZnSe:Mn or ZnS:Cu), have been developed. Doping with different luminescence activators in a semiconducting nanocrystal can tune the photoluminescence and electroluminescence at energies even lower than the band gap of the bulk material, whereas the quantum size effect can tune the excitation energy with the size of the quantum dots without having a significant change in the energy of the activator-related emission.

The widespread exploitation of quantum dot nanoparticles has been restricted by their physical/chemical instability and incompatibility with many of the materials and/or processes required to exploit the quantum dots to their full potential, such as incorporation into solvents, inks, polymers, glasses, metals, electronic materials, electronic devices, bio-molecules and cells. Consequently, a series of quantum dot surface modification procedures has been employed to render the quantum dots more stable and compatible with the materials and/or processing requirements of a desired application.

A particularly attractive potential field of application for quantum dots is the development of next generation light-emitting diodes (LEDs). LEDs are becoming increasingly important in modern-day life and it is envisaged that they have the potential to become one of the major applications for quantum dots, in for example, automobile lighting, traffic signals, general lighting, liquid crystal display (LCD) back-lighting and display screens.

Currently, LED devices are made from inorganic solid-state compound semiconductors, such as AlGaAs (red), AlGaInP (orange-yellow-green), and AlGaInN (green-blue); however, solid-state LEDs that emit white light cannot be produced using a mixture of currently available solid-state compound semiconductors. Moreover, it is difficult to produce "pure" colors by mixing solid-state LEDs of different frequencies. Therefore, the currently preferred method of color mixing to produce a desired color (including white), is to use a combination of phosphorescent materials that are placed on top of the solid-state LED whereby the light from the LED (the "primary light") is absorbed by the phosphorescent material and then re-emitted at a different frequency (the "secondary light"), i.e., the phosphorescent materials down-convert the primary light to the secondary light. Moreover, the use of white LEDs produced by phosphor down-conversion leads to lower cost and simpler device fabrication than a combination of solid-state red-green-blue LEDs.

Current phosphorescent materials used in down-converting applications absorb UV or mainly blue light and convert it to longer wavelengths, with most phosphors currently using trivalent rare-earth doped oxides or halophosphates. White emission can be obtained by blending phosphors which emit in the blue, green and red regions with that of a blue or UV-emitting solid-state device, i.e., a blue-light-emitting LED plus a green phosphor such as, $SrGa_2S_4:Eu^{2+}$, and a red phosphor such as, $SrSiEu^{2+}$ or a UV-light-emitting LED plus a yellow phosphor such as, $Sr_2P_2O_7:Eu^{2+};Mn^{2+}$, and a blue-green phosphor. White LEDs can also be made by combining a blue LED with a yellow phosphor; however, color control and color rendering are poor when using this methodology due to lack of tunability of the LEDs and the phosphor. Moreover, conventional LED phosphor technology uses down-converting materials that have poor color rendering (i.e., color rendering index (CRI)<75).

Rudimentary quantum dot-based light-emitting devices have been made by embedding colloidally produced quantum dots in an optically clear (or sufficiently transparent) LED encapsulation medium, typically a silicone or an acrylate, which is then placed on top of a solid-state LED. The use of quantum dots potentially has some significant advantages over the use of the more conventional phosphors, such as the ability to tune the emission wavelength, strong absorption properties and low scattering if the quantum dots are mono-dispersed.

For the commercial application of quantum dots in next-generation light-emitting devices, the quantum dots are preferably incorporated into the LED encapsulating material while remaining as fully mono-dispersed as possible and without significant loss of quantum efficiency. The methods of the prior art are problematic, due in large part to the nature of current LED encapsulants. Quantum dots can agglomerate when formulated into current LED encapsulants, thereby reducing the optical performance of the quantum dots. Moreover, even after the quantum dots have been incorporated into the LED encapsulant, oxygen can still migrate through the encapsulant to the surfaces of the quantum dots, which can lead to photo-oxidation and, as a result, a drop in quantum yield (QY).

In view of the significant potential for the application of quantum dots across such a wide range of applications, including but not limited to, quantum dot-based light-emitting devices, work has already been undertaken by various groups to try to develop methods to increase the stability of quantum dots so as to make them brighter, longer-lived, and/or less sensitive to various types of processing conditions. For example, reasonably efficient quantum dot-based light-emitting devices can be fabricated under laboratory conditions building on current published methods; however, there remain significant challenges to the development of quantum dot-based materials and methods for fabricating quantum dot-based devices, such as light-emitting devices, on an economically viable scale and which would provide sufficiently high levels of performance to satisfy consumer demand.

BRIEF SUMMARY OF THE INVENTION

An LED device according to the present invention has a cap containing one or more QD phosphors. The cap may be sized and configured to be integrated with standard LED packages. The QD phosphor is held within the well of the LED package, so as to absorb the maximum amount of light emitted by the LED, but arranged in spaced-apart relation from the LED chip to avoid excessive heat that can lead to complications. The packages may be manufactured and stored and subsequently assembled onto an LED device.

BRIEF DESCRIPTION OF THE SEVERAL VIEWS OF THE DRAWING(S)

DETAILED DESCRIPTION OF THE INVENTION

Figure 1:
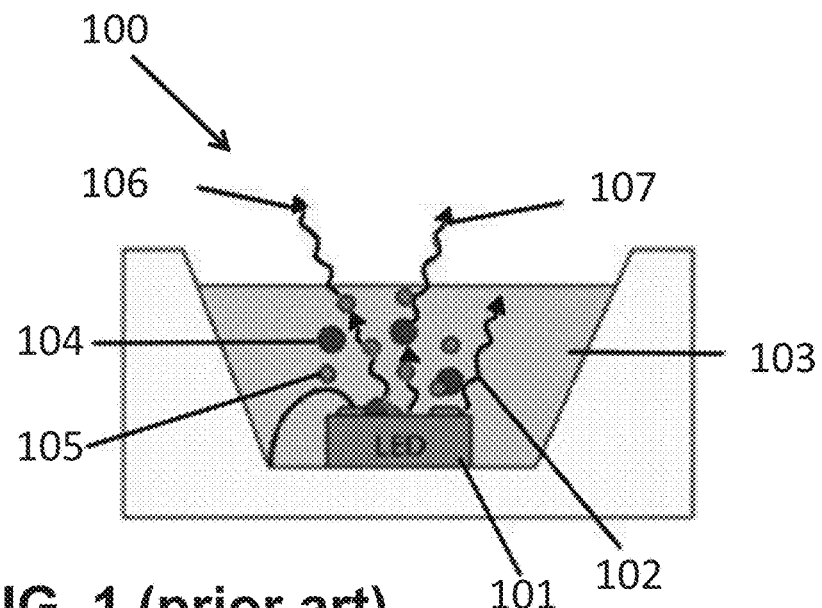
FIG. 1 illustrates a QD-containing LED device known in the art.

FIG. 1 illustrates a LED device 100, wherein solid-state LED 101 is arranged to emit blue primary light 102 upon the application of current. Solid-state LED is submerged in a commercially available LED encapsulant 103, in which is embedded a plurality of quantum dot-containing silica beads 104 and 105. Some of the beads 104 contain quantum dots that emit red secondary light 106 upon excitation by the blue primary light from the LED 101, and the remaining beads 105 contain quantum dots that emit green secondary light 107 upon excitation by the blue primary light from the LED 101. LED devices, as illustrated in FIG. 1, are described in more detail in commonly-owned U.S. patent application Ser. No. 12/888,982 filed Sep. 23, 2010, (published as U.S. 2011/0068322), the entire contents of which is hereby incorporated by reference.

Challenges with adapting quantum dots as light converting materials in LED-based lighting solutions stem from their air sensitivity, heat instability and reduction in light conversion efficiencies at higher temperatures. One method of reducing the air sensitivity is incorporating the QDs into beads, such as beads 104 and 105. However, the embodiment illustrated in FIG. 1 can still suffer from heat-related problems because the QDs are proximate the LED junction, which is typically the hottest-running part of an LED device.

Figure 2:
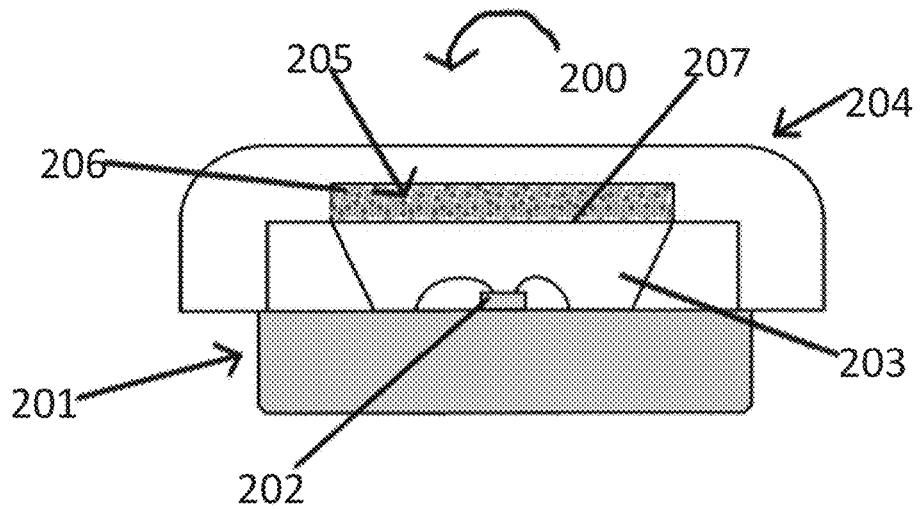
FIG. 2 illustrates an LED device equipped with a pre-assembled QD-containing cap.

FIG. 2 illustrates an improvement on the embodiment illustrated in FIG. 1. The LED device 200 of FIG. 2 includes a standard LED package 201 having an LED chip 202, disposed within a well 203. Well 203 may be filled with an LED encapsulant, as is known in the art. LED device 200 also includes a lid 204 having a cap well 205 (the term cap well is used herein to distinguish the well of the lid 205 from the well 203 of the LED package 201). QDs 206 are deposited within cap well 205. Well 205 may be equipped with a cover 207.

Lid 204 may be made of essentially any transparent material, such as polymer, ceramic, glass, or the like, and may be constructed using molding, casting, etc. Optionally, lid 204 may be shaped to provide a lens, a lens array, diffuser elements, and or other optical elements as are known in the art. Likewise, cover 207 may be made of glass, polymer, ceramic, or the like, and may be sealed to lid 204 by adhesion using a suitable UV curing epoxy resin, e.g. Optocast 3553 or other resin, as known in the art. Advantageously, the seal between cover 207 and lid 204 can form an oxygen impermeable barrier, thereby protecting QDs 206 from oxidation.

QDs 206 are typically semiconductor material that may incorporate ions from any one or more of groups 2 through 16 of the periodic table, and may include binary, ternary and quaternary materials, that is, materials incorporating two, three or four different ions respectively. By way of example, the nanoparticle may incorporate a semiconductor material, such as, but not limited to, CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge and combinations thereof. According to various embodiments, nanoparticles may have diameters of less than around 100 nm, less than around 50 nm, less than around 20 nm, less than around 15 nm and/or may be in the range of around 2 to 10 nm in diameter.

Nanoparticles that include a single semiconductor material, e.g., CdS, CdSe, ZnS, ZnSe, InP, GaN, etc. may have relatively low quantum efficiencies because of non-radiative electron-hole recombination that occurs at defects and dangling bonds at the surface of the nanoparticles. In order to at least partially address these issues, the nanoparticle cores may be at least partially coated with one or more layers (also referred to herein as "shells") of a material different than that of the core, for example a different semiconductor material than that of the "core." The material included in the, or each, shell may incorporate ions from any one or more of groups 2 to 16 of the periodic table. When a nanoparticle has two or more shells, each shell may be formed of a different material. In an exemplary core/shell material, the core is formed from one of the materials specified above and the shell includes a semiconductor material of larger band-gap energy and similar lattice dimensions as the core material. Exemplary shell materials include, but are not limited to, ZnS, ZnO, MgS, MgSe, MgTe and GaN. An exemplary multi-shell nanoparticle is InP/ZnS/ZnO. The confinement of charge carriers within the core and away from surface states provides nanoparticles of greater stability and higher quantum yield.

While the disclosed methods are not limited to any particular nanoparticle material, nanoparticles comprising materials that do not contain cadmium are particularly preferred. Examples of cadmium free nanoparticles include nanoparticles comprising semiconductor materials, e.g., ZnS, ZnSe, ZnTe, InP, InAs, InSb, AlP, AlS, AlAs, AlSb, GaN, GaP, GaAs, GaSb, PbS, PbSe, Si, Ge, including alloys and doped derivatives thereof, and, particularly, nanoparticles comprising cores of one of these materials and one or more shells of another of these materials. Particularly suitable QDs are CFQD® heavy metal-free quantum dots (Nanoco Technologies, Manchester, U.K.).

QDs 206 may be suspended in a matrix material such as a polymer such as an acrylate or epoxy polymer or a combination thereof. Bare QDs may be suspended in the matrix, or alternatively, the QDs may first be incorporated into beads, as described in U.S. Pub. Nos. 2011/0068322 and 2010/0123155, the entire contents of which are hereby incorporated by reference.

An advantage of the LED device 200 is that the lid 204 containing QDs 206 can have an appreciable shelf life prior to being incorporated onto the LED device. Thus, it is not critical that the LED device be made immediately following the construction of lid 204. This is in contrast to devices having the QDs deposited directly into the well of the LED package, because in those devices the QDs are typically not covered and isolated from the atmosphere until the entire package is assembled. LED device 200 thus provides greater flexibility of manufacture workflow. Moreover, during operation, the QDs 206 of LED device 200 are remote from LED chip 202 and are therefore not as susceptible to complications due to heating as they would be if they were proximate to the LED chip, as in the device of FIG. 1.

Figure 3A:
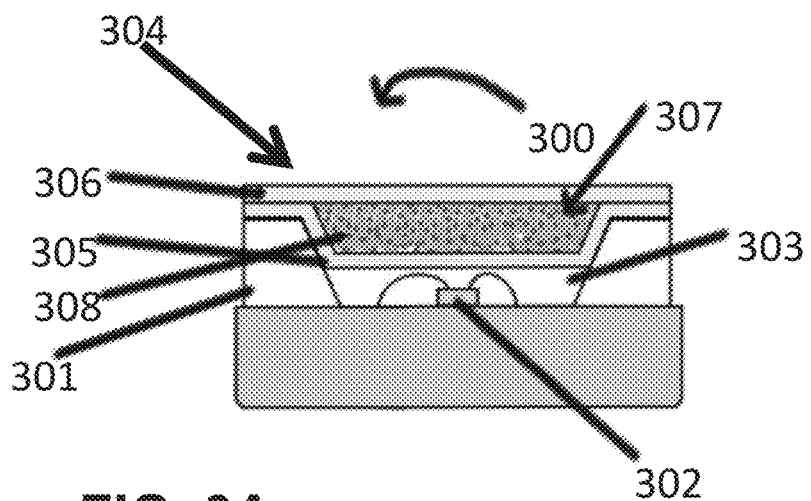
FIGS. 3A and 3B illustrate an alternative embodiment of an LED device equipped with a pre-assembled QD-containing cap.

FIG. 3A illustrates an alternative embodiment of an LED device 300, having an LED package 301 with an LED chip 302 and a well 303. Device 300 is provided with a cap 304 having a cap well part 305 that is designed to fit into well 303. Cap 304 also has a cap lid part 306 and a cavity 307, within which QDs 308 are contained. All of the materials discussed above in reference to the embodiment illustrated in FIG. 2 are also suitable for the embodiment illustrated in FIG. 3.

Figure 3B:
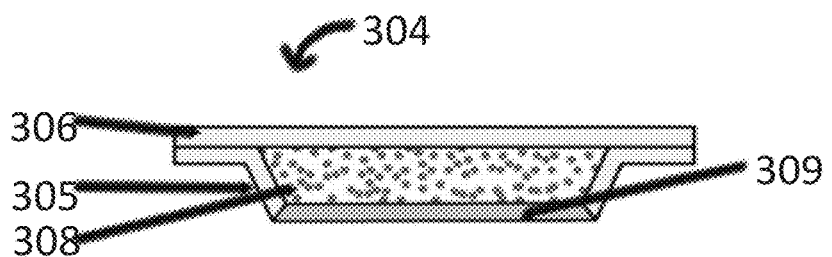

FIG. 3B illustrates a larger view of cap 304. According to one embodiment, an additional inorganic phosphor can be incorporated into the base wall 309 of cap 304. Exemplary phosphors include Ce:YAG, Ce:LuAG, and other broad emitting yellow-green phosphors. The combination of broad emitting yellow-green phosphors with red CFQD® heavy metal-free quantum dots in conjunction with a blue LED can produce a very high-quality light source. Thus, one embodiment is a single optical element combining both QD phosphors and conventional bulk phosphors.

As with the embodiment illustrated in FIG. 2, cap 304 can be constructed by molding, casting, etc. In the case of caps incorporating phosphor, a multi-step casting process may be necessary. Furthermore, a multistage casting process using a resin filled with white reflective material may be used for the walls and top of the cap while using a transparent colorless resin for the base to allow light from the LED to enter the cap.

A potential advantage of the embodiment illustrated in FIG. 3 over that of FIG. 2, is that the QD phosphor is situated closer to the LED chip in the FIG. 3 embodiment, and therefore absorbs more light. Consequently, less QD phosphor can be used. The QD phosphor is still protected from heat-caused deterioration by the base wall of the cap.

Table 1 compares measured optical performance data for an empty cap, as illustrated in FIG. 3B, the base of which is impregnated with Merck Isophor phosphor and the same cap containing red CFQD® heavy metal-free quantum dots (Nanoco Technologies Ltd., Manchester, U.K.) suspended in acrylate resin:

TABLE 1

| | Phosphor Only | Phosphor + QD |
|---|---|---|
| Radiant Flux (Watts) | 0.016 | 0.016 |
| Luminous Flux (lumens) | 4.6 | 4.2 |
| Chromaticity x coord | 0.249 | 0.383 |
| Chromaticity y coord | 0.324 | 0.332 |
| Efficacy | 76 | 70 |
| CRI | 65 | 82 |

Figure 4:
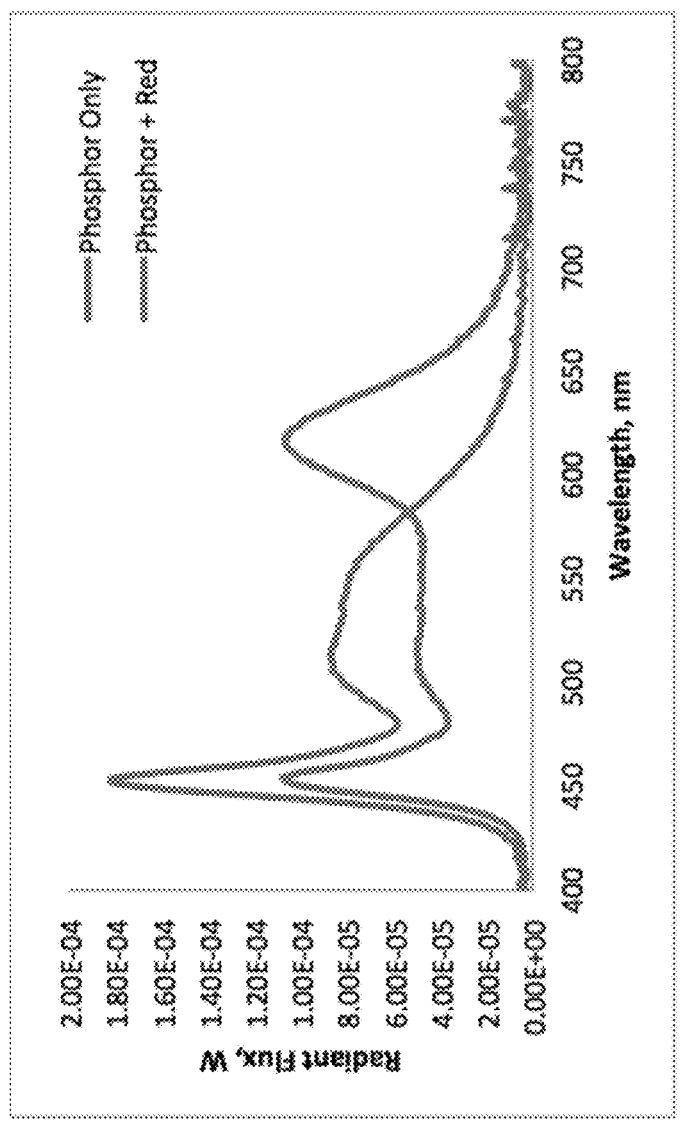
FIG. 4 is the spectral power distributions of the empty cap with Merck Isophor phosphor embedded into the base (blue line) and same cap with containing red QDs suspended in acrylate resin (red line).

FIG. 4 illustrates the spectral power distributions of the empty cap with Merck Isophor phosphor embedded into the base (blue [or solid] line) and the same cap containing red QDs suspended in acrylate resin (red [or dashed] line).

Caps were prepared as described below to fit standard 3528 and 5050 LED packages.

EXAMPLE 1

Caps, as illustrated in FIG. 3, were prepared using a casting method utilizing pairs (male/female) of silicone molds. Into a female mold, 6 microliters of Optocast 3553 epoxy resin were dispensed. The male mold was then put in place with care to ensure the locator points were aligned. During this stage any excess resin is expelled from the cap mold reservoir and leaks into the space between the mold pair. The mold was then irradiated with UV light to cure the epoxy resin. The conditions for the cure are as follows: 360 nm, 170 mW/cm$^2$, 72 seconds. After curing, the caps were de-molded and stored for 24 hours at room temperature after which excess flashing was removed using a scalpel. The caps were transparent and could be used with QD phosphor.

EXAMPLE 2

Figure 5:
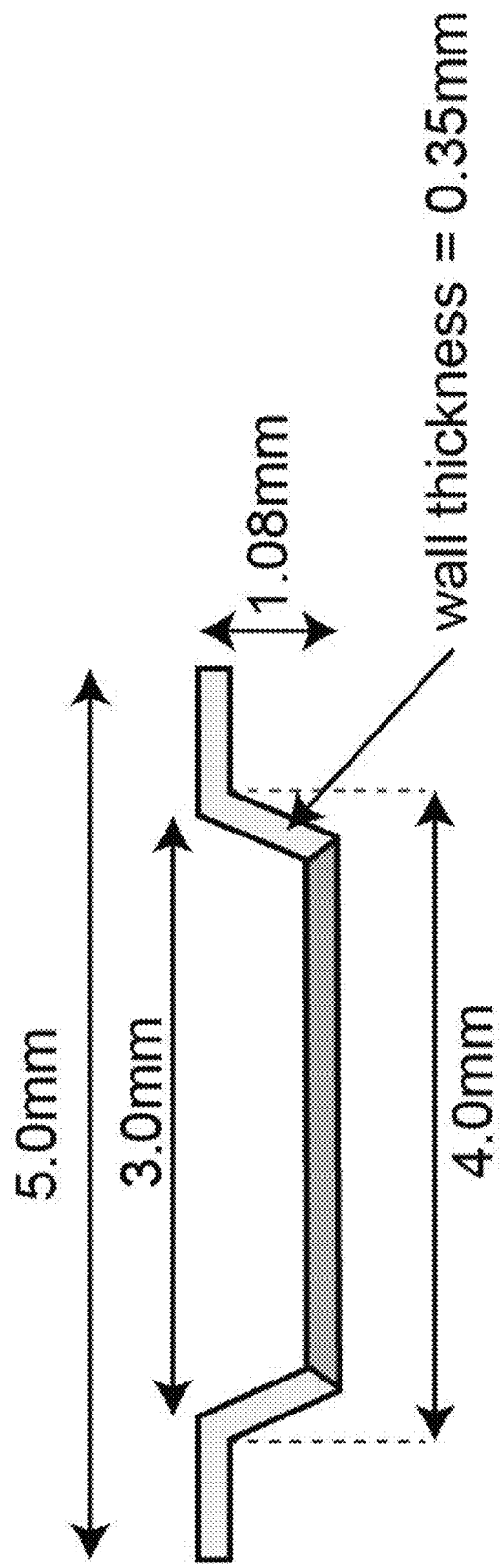
FIG. 5 is a schematic illustration of a pre-assembled QD-containing cap, showing dimensions.

Caps with a phosphor-impregnated base were prepared using a two-stage process. Firstly, the base was prepared by mixing the appropriate amount of phosphor into uncured Optocast 3553 epoxy resin. 3 microliters was dispensed into mold, which is of the same width dimensions as the base of the cap but 50 microns thinner. The epoxy was cured by irradiating with UV light. The conditions for the cure were as follows: 360 nm, 170 mW/cm$^2$, 72 seconds. To fabricate the finished cap, the phosphor base was incorporated into the final cap as follows: 15 microliters of uncured Optocast 3553 epoxy resin were deposited into the female 5050 silicone mold. The phosphor base was then introduced and pushed carefully to the bottom of the mold taking care not to entrap any air. The male 5050 silicone mold was then introduced with care to ensure the locator points were aligned. Excess epoxy resin is expelled from the mold and forms flashing once cured. The cure conditions used were as described above. Most dimensions are determined by the LED package. The wall thickness of the caps used in these examples of the 5050 cap was 350 microns, as shown in FIG. 5.

EXAMPLE 3

Caps for 5050 packages with phosphor-impregnated bases were prepared as described above. In an inert atmosphere glove box, these were filled with 7 microliters of CFQD-containing acrylate resin and cured (360 nm, 170 mW/cm$^2$, 180 seconds). A lid prepared from 150-micron-thick borosilicate glass was applied by depositing 5 microliters of Optocast 3553 epoxy resin onto the acrylate resin then pushing the lid down firmly in place. The epoxy was cured by UV light (360 nm, 170 mW/cm², 72 seconds). These caps were used to generate the data in FIG. 4 and Table 1, above.

An important aspect of the invention is that a cap design according to the invention allows the color-converting material to be situated within the package of the LED and take advantage of the package reflectors for improved light output and beam shaping.

Figure 6A:
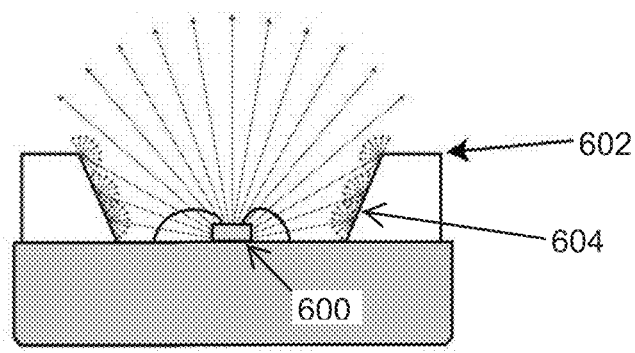
FIG. 6A illustrates light rays emanating from an LED package of the prior art.

FIG. 6A illustrates a blue-emitting LED 600 in a package 602 of the prior art. Some of the light rays emitted by the LED reflect off the walls 604 of the package well 602 within which LED 600 is situated. White wall material may be used if Lambertian reflection is desired. In applications requiring specular reflection, the walls may be silvered. Due to beam shaping by LED package 602, there is little blue intensity at wide angles.

Figure 6B:
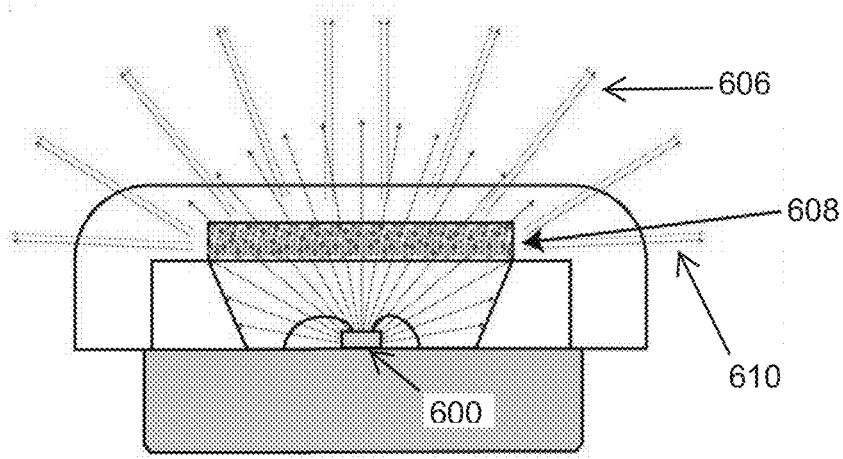
FIG. 6B shows a conventional LED package equipped with a QD-containing cap according to the embodiment illustrated in FIG. 2.

FIG. 6B shows a conventional LED package (as 602 in FIG. 6A) equipped with a QD-containing cap according to the embodiment illustrated in FIG. 2. Cap well 608 contains green- and red-emitting quantum dots that fluoresce by means of excitation by blue-emitting LED 600. Due to beam shaping by the LED package, there is little blue intensity at wide angles. As indicated by rays 610, photoluminescence from the quantum dots within cap well 608 emitted in a lateral direction can be directly observed at wide angles. However, the absence of blue light (from LED 600) in rays 610 results in a different color being observed and the color uniformity over angle is thereby compromised.

Figure 6C:
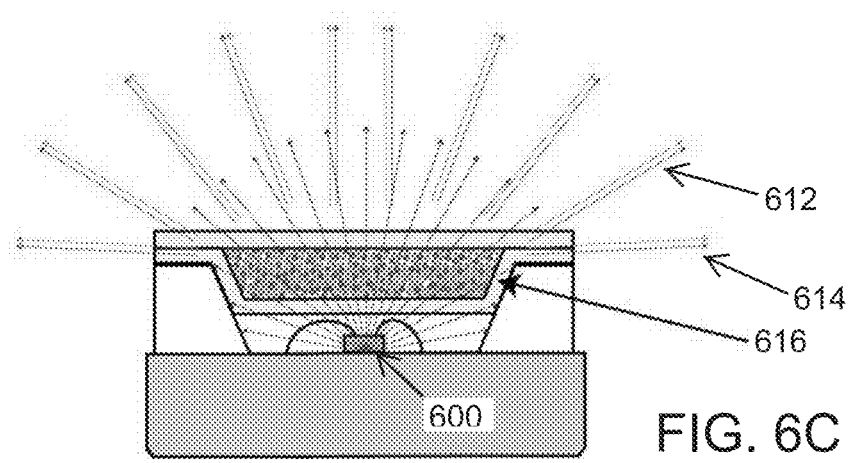
FIG. 6C shows light rays emanating from a cap according to the embodiments of the invention illustrated in FIGS. 3A and 3B.

FIG. 6C shows how a cap according to the embodiments of the invention illustrated in FIGS. 3A and 3B overcome the color-uniformity-over-angle problem illustrated in FIG. 6B and discussed above. Photoluminescence from the quantum dots within recessed cap well 616 can reflect off the walls of the LED package before escaping the device. This results in less QD-only photoluminescence (rays 614) being observed at wide angles thereby leading to improved color uniformity over angle (rays 612 comprising red, green, and blue light).

Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. A cap for an LED package having a central well containing an LED and an upper surface surrounding the central well, said cap comprising:
a peripheral portion sized and configured to engage the upper surface of the LED package; a central portion depressed from the peripheral portion and comprising a side wall and a base wall, the side wall and the base wall lining a cap well;
a phosphor incorporated in the base wall of the cap; and
a plurality of quantum dots in the cap well,
wherein the side wall of the cap is configured to abut the central well of the LED package.

2. The cap recited in claim 1, further comprising:
a lid attached to the peripheral portion and covering the cap well.

3. The cap recited in claim 2, wherein the lid is transparent.

4. The cap recited in claim 2, wherein the lid is translucent.

5. The cap recited in claim 2, wherein the lid is shaped to provide a lens array.

6. The cap recited in claim 2, wherein the lid comprises a light diffuser.

7. The cap recited in claim 1, wherein the cap well is spaced apart from the LED when the cap is engaged with the LED package.

8. The cap recited in claim 1, wherein the plurality of quantum dots comprise a first type of quantum dots that emit secondary light having a first wavelength and a second type of quantum dots that emit secondary light having a second wavelength.

9. The cap recited in claim 8, wherein the first type of quantum dots emit green light when excited by blue light and the second type of quantum dots emit red light when excited by blue light.

10. The cap recited in claim 1, wherein the quantum dots comprise a central core surrounded by at least one shell.

11. The cap recited in claim 10, wherein the shell material is different from the core material.

12. The cap recited in claim 1, wherein the quantum dots comprise a core comprising indium and phosphorus surrounded by a first shell comprising ZnS surrounded by a second shell comprising ZnO.

13. The cap recited in claim 1, wherein the quantum dots are cadmium-free quantum dots.

14. The cap recited in claim 1, wherein the quantum dots are suspended in a matrix.

15. The cap recited in claim 14, wherein the matrix comprises an acrylate polymer.

16. The cap recited in claim 14, wherein the matrix comprises an epoxy polymer.

17. The cap recited in claim 1, wherein the quantum dots are incorporated into beads.

18. The light-emitting device recited in claim 1, wherein the phosphor is a broad-emitting, inorganic yellow-green phosphor.

19. The light-emitting device recited in claim 1, wherein the phosphor comprises Ce:YAG or Ce:LuAG.

20. A light-emitting device comprising: a package having a central well and an upper surface;
an LED within the central well; and a cap comprising:
a peripheral portion configured to engage the upper surface of the package; and
a central portion depressed from the peripheral portion, the central portion comprising a side wall extending into the central well and a base wall, the side wall and the base wall lining a cap well;
a phosphor incorporated in the base wall of the cap: and
a plurality of quantum dots in the cap well, wherein the side wall of the cap abuts at least a portion of the central well.

21. The light-emitting device recited in claim 20, wherein the peripheral portion of the cap is attached to the upper surface of the package with an adhesive that is substantially impervious to oxygen.

22. The light-emitting device recited in claim 20, wherein the phosphor is an inorganic phosphor.

23. The light-emitting device recited in claim 20, wherein the phosphor is a broad-emitting, yellow-green phosphor.

24. The light-emitting device recited in claim 20, wherein the phosphor comprises Ce:YAG.

25. The light-emitting device recited in claim 20, wherein the phosphor comprises Ce:LuAG.

26. A light-emitting device comprising: a package having a central well and an upper surface; an LED within the central well; and a cap comprising:
a peripheral portion attached to the upper surface of the package;

a central portion depressed from the peripheral portion, the central portion comprising a side wall extending into the central well and a base wall, the side wall and base wall lining a cap well;

a phosphor incorporated in the base wall of the cap well; and a plurality of quantum dots in the cap well, wherein the side wall of the cap abuts the central well of the package.

27. The light-emitting device recited in claim 26 wherein the LED is a blue LED, the phosphor is a broad-emitting, yellow-green phosphor, and the quantum dots are red-fluorescing quantum dots.

* * * * *